United States Patent
Kwon et al.

(10) Patent No.: US 6,803,852 B2
(45) Date of Patent: Oct. 12, 2004

(54) SENSOR FOR PREVENTING AUTOMOBILE CRASHES BY USING PHOTONIC QUANTUM RING LASER ARRAY

(75) Inventors: O'Dae Kwon, Pohang (KR); Byeong-hoon Park, Pohang (KR)

(73) Assignee: Pohang University of Science and Technology Foundation, Pohang (KR)

( * ) Notice: Subject to any disclaimer, the term of this patent is extended or adjusted under 35 U.S.C. 154(b) by 80 days.

(21) Appl. No.: 10/147,077

(22) Filed: May 17, 2002

(65) Prior Publication Data

US 2003/0107480 A1 Jun. 12, 2003

(30) Foreign Application Priority Data

Dec. 12, 2001 (KR) ........................................ 2001-78661

(51) Int. Cl.$^7$ ................................................ B60Q 1/00
(52) U.S. Cl. .................... 340/435; 340/436; 250/493.1; 356/956
(58) Field of Search ................................. 340/435, 436; 356/28, 956; 359/549; 250/493.1

(56) References Cited

U.S. PATENT DOCUMENTS 6,597,437 B1 * 7/2003 Kongable .................. 356/3.01
2003/0214696 A1 * 11/2003 Oettinger et al. ........... 359/290

* cited by examiner

*Primary Examiner*—Julie Lieu
(74) *Attorney, Agent, or Firm*—Leydig, Voit & Mayer, Ltd.

(57) ABSTRACT

A sensor prevents automobile crashes by collecting information such as a distance between automobiles, speed, and acceleration by utilizing a phenomenon that a photonic quantum ring laser emits light rays having different wavelengths associated with varying angles of the radiation from the photonic quantum ring. The sensor for preventing automobile crashes includes a photonic quantum ring laser array emitting lasing light beams having different wavelengths according to the view angle, a reflection unit for reflecting the light beams oscillated from the photonic quantum ring laser array, and a detection unit for detecting the light beams reflected by the reflection unit.

20 Claims, 2 Drawing Sheets

SENSOR FOR PREVENTING AUTOMOBILE CRASHES BY USING PHOTONIC QUANTUM RING LASER ARRAY

BACKGROUND OF THE INVENTION

1. Field of the Invention

The present invention relates to a sensor for preventing automobile crashes by using a photonic quantum ring laser array, and more particularly, to a sensor for preventing automobile crashes by collecting information such as a distance between automobiles, speed, and acceleration by using a phenomenon that a photonic quantum ring laser emits light rays having different wavelengths associated with varying angles of the radiation from the photonic quantum ring.

2. Description of the Related Art

The structure and feature of the photonic quantum ring laser is disclosed in Korean Patent No. 10-0288612 granted on 8 Feb. 2001 based on an application filed on 19 Jan. 1999, entitled "Photonic Quantum Ring Laser Diode, Array Thereof, and Manufacturing Method". An example of an angle and altitude measuring apparatus using the photonic quantum ring laser is disclosed in detail in another Korean Patent No. 10-0260271 granted on 4 Apr. 2000 based on an application filed on 3 Feb. 1998, entitled "Angle and Altitude Measuring Apparatus Using the Photonic Quantum Ring Laser".

In the conventional technology to Korean Patent No. 10-0288612, an optical spectrum analyzer is employed as a means for detecting and analyzing a reflected laser beam. However, since the optical spectrum analyzer is quite expensive, it is in adequate to commercialize the above technology.

In the conventional technology according to Korean Patent No. 10-0260271, since the optical spectrum analyzer and the photonic quantum ring laser are configured as separate apparatuses to measure an angle, carrying and management of the apparatus is difficult. Also, since the optical spectrum analyzer, when installed at an automobile, must be attached at an accurate position corresponding to the angle of reflected laser beam and there must not be movements, installing the apparatus in an actual automobile requires accurate alignment.

SUMMARY OF THE INVENTION

It is an object of the present invention to provide an optical sensor for preventing automobile crashes by using a combination of an inexpensive commercial photodiode and a filter, replacing an expensive optical spectrum analyzer.

Also, it is an object of the present invention to provide an integrated single chip by incorporating a filter-photodiode system or a grating-ccd system, and a photonic quantum ring laser array to facilitate installation thereof at an actual automobile.

Also, it is an object of the present invention to provide a sensor for preventing automobile crashes by automatically operating an alarming device or controlling a steering wheel or braking system when an object or automobile approaches within a predetermined distance by using data for the distance between automobiles, speed, and acceleration.

To achieve the above object, there is provided a sensor for preventing automobile crashes comprising a photonic quantum ring laser array for lasing light beams having different wavelengths according to the view angle, a reflection unit for reflecting the light beams emitted from the photonic quantum ring laser array, and a detection unit for the light beams reflected by the reflection unit.

It is preferred in the present invention that the photonic quantum ring laser array and the detection unit are integrated into a single sensor chip.

It is preferred in the present invention that the integrated sensor chip and the reflection unit form a predetermined angle.

It is preferred in the present invention that the photonic quantum ring laser array and the reflection unit form a predetermined angle.

It is preferred in the present invention that the reflection unit has a cubic mirror structure.

It is preferred in the present invention that the detection unit comprises a band-pass optical filter for passing a laser beam having a particular wavelength among the reflected laser beams, and a photodiode for generating a voltage corresponding to the laser beam having the particular wavelength passing through the band-pass optical filter.

It is preferred in the present invention that the band-pass optical filter is a multi-layer type dielectric filter.

On the other hand, the detection unit can be replaced by an alternative system consisting of a grating and a 1-dimensional CCD array, which can have a better resolving power than the filter-photodiode system.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF THE INVENTION

Figure 1:
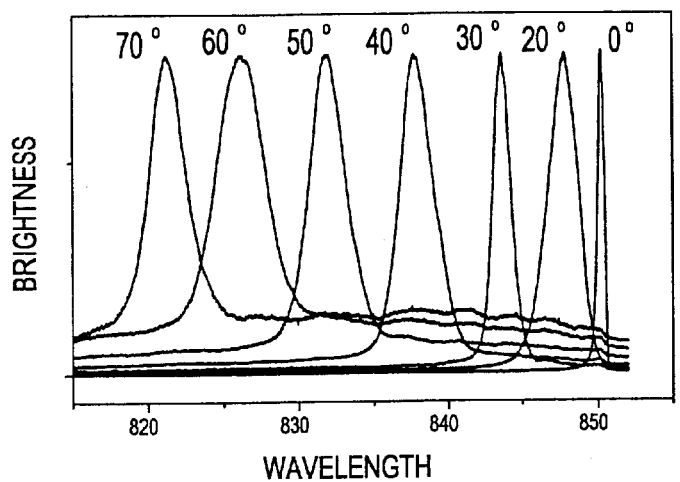
FIG. 1 is a view showing a multi-wavelength feature of a photonic quantum ring laser according to the view angle.

Referring to FIG. 1, although the lasing wavelength of the photonic quantum ring laser is determined depending on the feature of a gain material of an active layer, a degree of the blueshift of a lasing wavelength according to the view angle is consistent regardless of the type of the active layer. That is, as the view angle to a surface increases according to an off-normal Fabry-Perot resonance condition in a 3D toroidal cavity, an output wavelength decreases compared to a wavelength resonant from the surface normal direction of a device.

Figure 2:
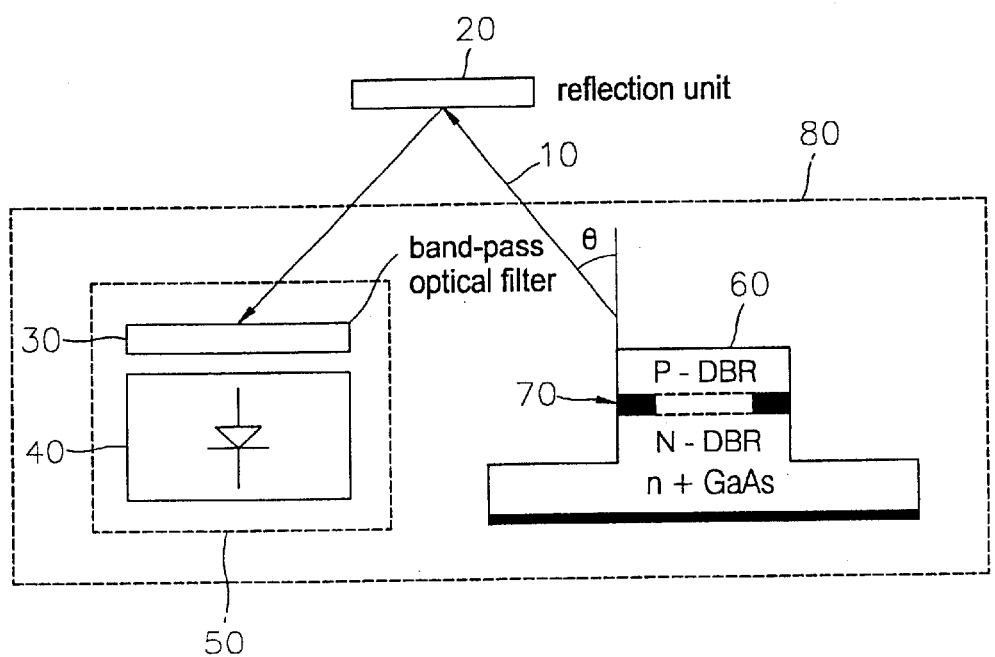
FIG. 2 is a side view of the structure of a sensor chip made by incorporating a single photonic quantum ring laser, a band-pass filer, and a photodiode, and a reflection plate, of a sensor for preventing automobile crashes according to the present invention.

FIG. 2 shows the structure of a sensor chip 80 formed of a combination of a single photonic quantum ring laser 60, a photodiode 40, and a band-pass optical filter 30, and a reflection unit 20. The sensor chip 80 may be a simple combination or an integrated single chip of the photonic quantum ring laser 60 including a lower reflection layer (n-distributed Bragg reflector: n-DBR), an upper reflection layer (p-distributed Bragg reflector: p-DBR), and an active layer 70 having a toroidal cavity, which are formed in a peripheral region of the active layer, and a detection unit 50 including a multi-layer type band-pass filter 30 and a p-n- or p-i-n junction semiconductor photodiode 40.

The fundamental principle of the photonic quantum ring laser is described below based on the structure shown in FIG. 2. A laser beam 10 emitted from the photonic quantum ring laser 60 and having a particular wavelength according to the view angle is incident on a reflection unit 20 such as an object/automobile and reflected therefrom to the sensor chip 80. The reflected laser beam selectively passes through the multi-layer type band-pass filter 30 formed on a semiconductor photodiode (not shown) such as Si or InGaAs. Photoelectric current of the photodiode generated by the laser beam passing through the multi-layer type band-pass filter 30 outputs a voltage signal. The output signal undergoes a signal processing step to generate information about an angle between the object and the sensor. An approaching automobile can be recognized by the accumulation of the information.

Figure 3:
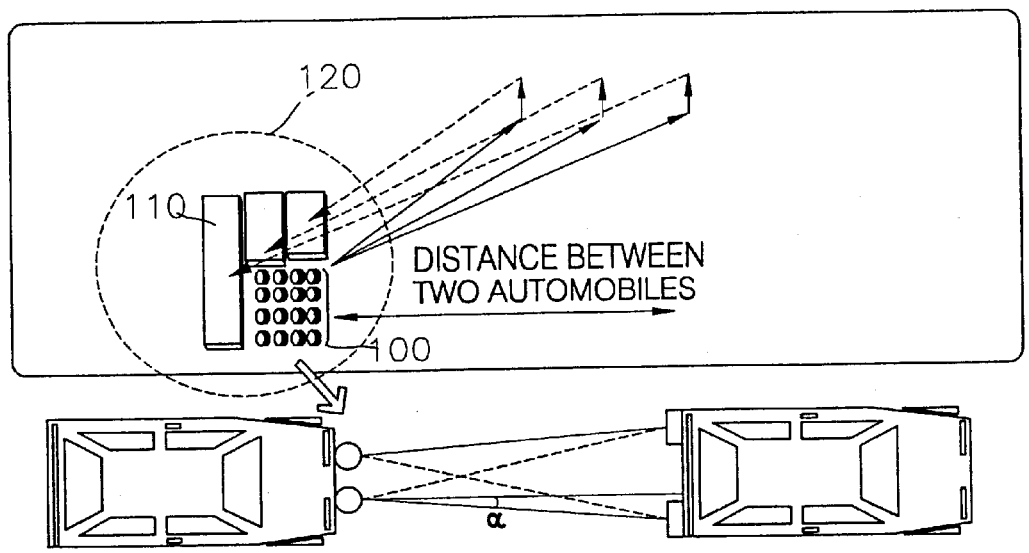
FIG. 3 is a view showing an example in which the automobile crash prevention sensor according to the present invention is installed at an actual automobile.

FIG. 3 shows the structure of the sensor chip 120, which is integrated by including the photonic quantum ring laser array 100 and a detection unit 110, of a sensor for preventing automobile crashes of the present invention, and an example of the present invention. In FIG. 3, assuming that two automobiles are linearly arranged, the sensor chip 120 is attached to the left and right sides of a front bumper of the following automobile such that an angle made by a rear lamp of a leading automobile and the sensor chip 120 forms a predetermined angle α. Each of the left and right sensor chips 120 separately drives a photonic quantum ring laser in a pulse type and processes the signal detected by the detection unit 110, so that a degree of approach of the automobile is recognized and an alarming apparatus can be operated. The reason for attaching the sensor chip 120 at the angle α with respect to the position of the rear lamp of the automobile is to utilize the feature of transition of a wavelength according to an angle of the photonic quantum ring laser at its maximum. To enable the photonic quantum ring laser that is a core element of the sensor to be recognized from a medium or long distance, as shown in the photonic quantum ring laser array 100 of FIG. 3, a several K bits level array or a plurality of 1 K bit level arrays having a high output power is used. A commercial Si or InGaAs semiconductor photodiode can be employed as visible or infrared wavelength-range detector, individually. The band-pass optical filter which are structural elements of the detection unit 110 is a multi-layer dielectric filter.

In the case of the silicon photodiode, since it has a detection range between 03–1.1 μm, a sufficient range to absorb the output wavelength of the laser is secured. Since the band-pass filter has a narrow full width at half maximum as the number of layers increases, performance to select a particular wavelength is improved. The InGaAs photodiode is used when a long wavelength laser is used. Since the sensor chip is formed of optical filters with three or more particular wavelengths, information about distance and speed can be sufficiently obtained and thus a cheap sensor can be realized.

Figure 4:
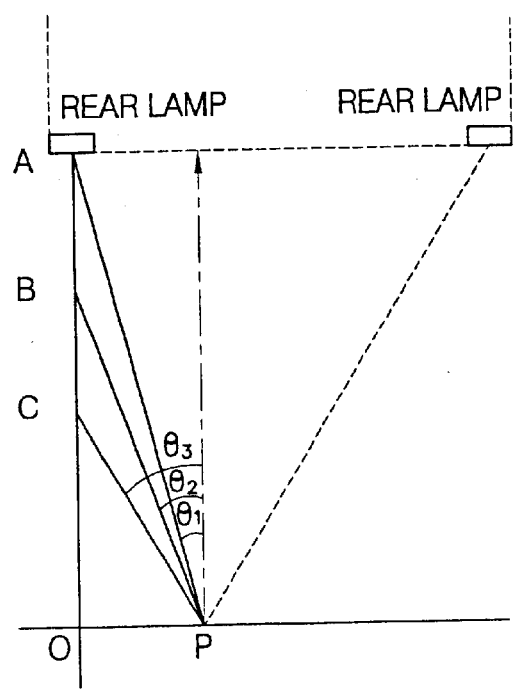
FIG. 4 is a view showing a method of obtaining distance information through the measurement of an angle.

FIG. 4 shows the concept of calculating distance, speed and acceleration from the angle information obtained from the crash prevention sensor. As described above, the position P at which the crash prevention sensor is attached has an angle of α.

The angle between the automobile approaching a point A at time t1 and the sensor is θ1 (=λ1). The distance $\overline{OA}=\overline{OP}$ tan(90−θ$_1$) between the neighboring automobiles can be accurately obtained from the above angle. Likewise, the distance between two automobiles at the time t2 is $\overline{OB}=\overline{OP}$ tan(90−θ$_2$) and the distance between two automobiles at the time t3 is $\overline{OC}=\overline{OP}$ tan(90−θ$_3$). When the distance between the automobiles are obtained, speed v12 and v23 and acceleration a can be obtained therefrom which are shown below.

$$\frac{\overline{OA}-\overline{OB}}{t_2-t_1}=v_{12},\ \frac{\overline{OB}-\overline{OC}}{t_3-t_2}=v_{23},\text{ and } a=\frac{v_{12}-v_{23}}{t_3-t_2}$$

The information about the distance, speed, and acceleration obtained as above are important values to avoid and prevent automobile crashes. In signal processing, when an automobile approaches within a predetermined distance, acceleration and deceleration is determined so that an alarming apparatus operates or a steering system/braking system is automatically controlled to avoid a possible crash.

The above description shows a preferred embodiment of the present invention. However, the present invention is not limited thereto and can be modified in various ways. For example, if the sensor chip is attached to not only the front bumper, but also at the side surfaces or rear surface of an automobile, an intelligent transportation system can be realized and it can be displayed on a dashboard of a driver in what direction an automobile approaches.

Also, a combination of a cheap photodiode and optical filter can replace an expensive optical spectrum analyzer. Further, by integrating the photodiode, the optical filter, and the photonic quantum ring laser, an actual installation thereof at an automobile becomes more convenient.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A sensor comprising:
   a photonic quantum ring laser array emitting laser light beams having different wavelengths according to a view angle;
   a reflection unit for reflecting the light beams emitted prom the photonic quantum ring laser array; and
   a detection unit for detecting the light beams reflected by the reflection unit; and
   wherein said sensor is used for preventing automatic crashes.

2. The sensor as claimed in claim 1, wherein the photonic quantum ring laser array and the detection unit are integrated into a single sensor chip.

3. The sensor as claimed in claim 2, wherein the integrated sensor chip and the reflection unit form a predetermined angle.

4. The sensor as claimed in claim 1, wherein the photonic quantum ring laser array and the reflection unit form a predetermined angle.

5. The sensor as claimed in claim 2, wherein the photonic quantum ring laser array and the reflection unit form a predetermined angle.

6. The sensor as claimed in claim 1, wherein the reflection unit has a cubic mirror structure.

7. The sensor as claimed in claim 2, wherein the reflection unit has a cubic mirror structure.

8. The sensor as claimed in claim 3, wherein the reflection unit has a cubic mirror structure.

9. The sensor as claimed in claim 1, wherein the detection unit comprises a band-pass optical filter for passing a laser beam having a particular wavelength, from among the reflected laser beams, and a photodetector generating a voltage corresponding to the laser beam having the particular wavelength passing through the band-pass optical filter.

10. The sensor as claimed in claim 2, wherein the detection unit comprises a band-pass optical filter for passing a laser beam having a particular wavelength, from among the reflected laser beams, and a photodetector generating a voltage corresponding to the laser beam having the particular wavelength passing through the band-pass optical filter.

11. The sensor as claimed in claim 3, wherein the detection unit comprises a band-pass optical filter for passing a laser beam having a particular wavelength, from among the reflected laser beams, and a photodetector generating a voltage corresponding to the laser beam having the particular wavelength passing through the band-pass optical filter.

12. The sensor as claimed in claim 6, wherein the band-pass optical filter is a multi-layer dielectric filter.

13. The sensor as claimed in claim 1, wherein the detection unit comprises a grating for passing a laser beam having a particular wavelength, from among the reflected laser beams, and a photodetector generating a voltage corresponding to the laser beam having the particular wavelength passing through the grating.

14. The sensor as claimed in claim 9, wherein the photodetector is a photodiode.

15. The sensor as claimed in claim 9, wherein the photodetector is a charge coupled device.

16. The sensor as claimed in claim 2, wherein the detection unit comprises a grating for passing a laser beam having a particular wavelength, from among the reflected laser beams, and a photodetector generating a voltage corresponding to the laser beam having the particular wavelength passing through the grating.

17. The sensor as claimed in claim 16, wherein the photodetector is a photodiode.

18. The sensor as claimed in claim 16, wherein the photodetector is a charge coupled device.

19. The sensor as claimed in claim 3, wherein the detection unit comprises a grating for passing a laser beam having a particular wavelength, from among the reflected laser beams, and a photodetector generating a voltage corresponding to the laser beam having the particular wavelength passing through the grating.

20. The sensor as claimed in claim 19, wherein the photodetector is a photodiode.

* * * * *